(12) United States Patent
Tamai

(10) Patent No.: US 7,208,811 B2
(45) Date of Patent: Apr. 24, 2007

(54) PHOTO-DETECTING DEVICE

(75) Inventor: Seiichiro Tamai, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 153 days.

(21) Appl. No.: 11/082,690

(22) Filed: Mar. 18, 2005

(65) Prior Publication Data

US 2005/0212045 A1    Sep. 29, 2005

(30) Foreign Application Priority Data

Mar. 24, 2004    (JP)    ............... 2004-087510

(51) Int. Cl.
*H01L 31/06*    (2006.01)
(52) U.S. Cl. ............... 257/461; 257/347; 257/E21.561; 257/E27.112
(58) Field of Classification Search .......... 257/14, 257/94, 185
See application file for complete search history.

(56) References Cited

U.S. PATENT DOCUMENTS 5,965,875 A    10/1999    Merrill

2002/0101895 A1*    8/2002    Augusto ............... 372/44

FOREIGN PATENT DOCUMENTS

JP    5-183139    7/1993

OTHER PUBLICATIONS

English Language Abstract of JP 5-183139.
* cited by examiner

*Primary Examiner*—Andy Huynh
*Assistant Examiner*—Earl N. Taylor
(74) *Attorney, Agent, or Firm*—Greenblum & Bernstein, P.L.C.

(57) ABSTRACT

A photo-detecting device that enables a solid-state image sensor to meet the requirement of higher quality imaging including: a first silicon substrate 120 having p- and n-type regions; a first SOI substrate 130 in which a second silicon substrate 132 having p- and n-type regions is formed on a first SOI insulation layer 131; and a second SOI substrate 140 in which a third silicon substrate 142 having p- and n-type regions is formed on a second SOI insulation layer 141. Each pn-junction of the first silicon substrate 120, the second silicon substrate 132, and the third silicon substrate 142 forms a photodiode for converting incident light into electric charges. The depth of each pn-junction, which is measured from the surface of the second SOI substrate 140 irradiated with the light, is determined according to absorption length of light to be converted into electric charges.

17 Claims, 11 Drawing Sheets

FIG. 2

| R | G | R | G |
|---|---|---|---|
| G | B | G | B |
| R | G | R | G |
| G | B | G | B |
| R | G | R | G |

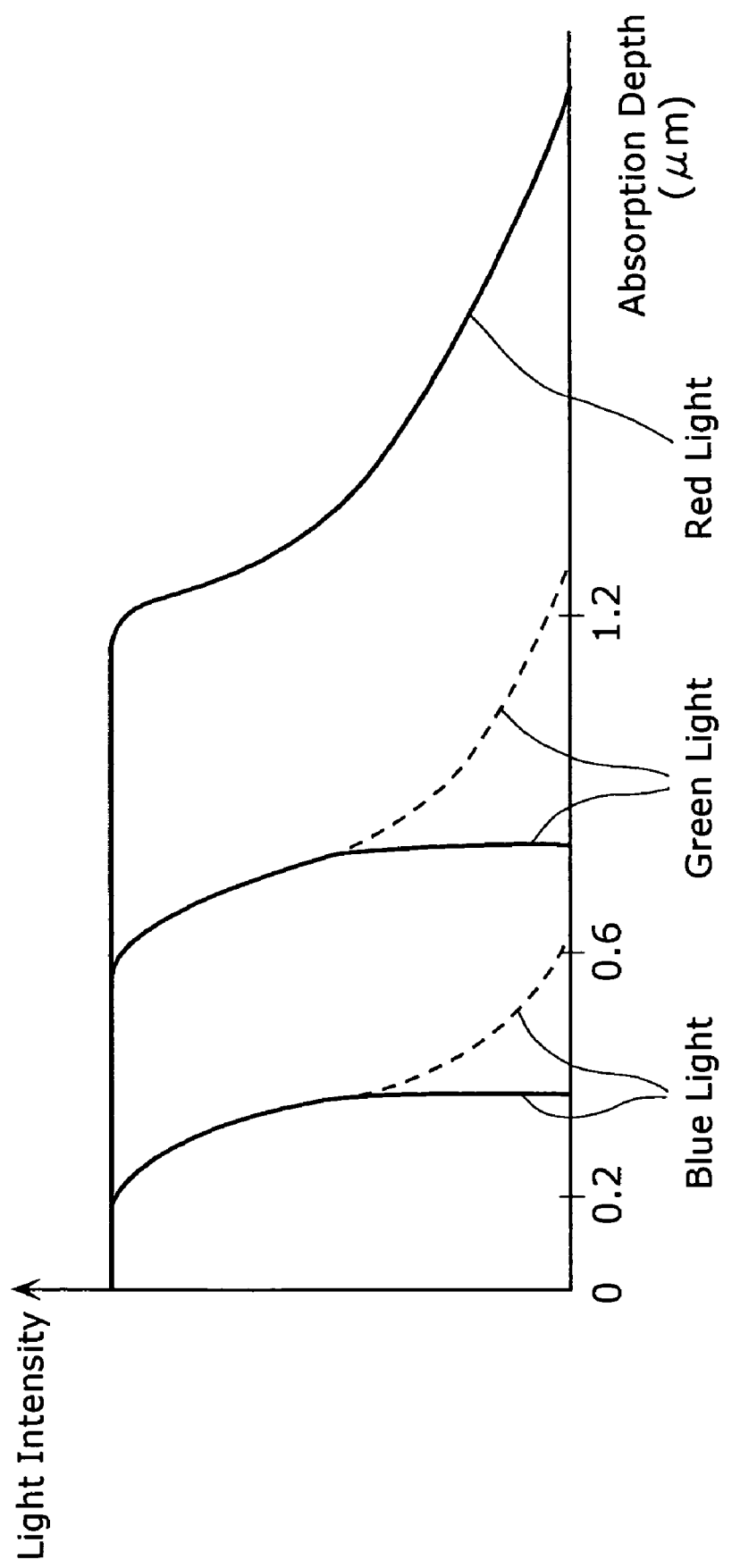

PHOTO-DETECTING DEVICE

BACKGROUND OF THE INVENTION (1) Field of the Invention

The present invention relates to a photo-detecting device, and more particularly to a photo-detecting device in a solid-state image sensor.

(2) Description of the Related Art

Charge-coupled device (CCD) or metal-oxide-semiconductor (MOS) solid-state image sensors are mounted on digital still cameras, camcorders, and the like. Such solid-state image sensors convert light incident on photo-detecting devices into electric charges. In the CCD solid-state image sensor, the generated signal charges are accumulated in potential wells, and then transferred. In the MOS solid-state image sensor, on the other hand, the generated signal charges are read out as voltage directly from the photo-detecting devices using MOS transistors. Imaging areas in those solid-state image sensors, in which the photo-detecting devices are two-dimensionally arranged, have red-green-blue (RGB) primary color filters with the Bayer or stripe type color array for colorization (for example, refer to Japanese Patent Laid-Open No. 5-183139 publication).

FIG. 1 is a cross-sectional view showing structures of the photo-detecting device in the conventional MOS solid-state image sensor and its periphery.

The conventional solid-state image sensor is comprised of: a plurality of photo-detecting devices 810 that is a plurality of n-type regions formed in a p-type silicon substrate 800; a color filter 820 that is placed at light incident side of the photo-detecting devices 810; and a plurality of output amplifiers 830 that have each MOS transistor 831, that are connected with the photo-detecting devices 810, and that convert signal charges into voltage, and amplify and output the voltage.

It should be noted that RGB primary colors in the color filter 820 are arranged in the Bayer type color array as shown in FIG. 2.

SUMMARY OF THE INVENTION

In recent years, it has been required to provide a solid-state image sensor with higher performance, higher quality imaging, more reduction in weight, and the like.

However, the conventional solid-state image sensor selects red, green, blue light from light incident on each photo-detecting device using the color filter, so that light not being passed by the color filter is absorbed in the filter and wasted. This results in a problem that the conventional solid-state image sensor has low efficiency of use for available light in the photo-detecting device and eventually reduces color reproducibility of images, so that the conventional solid-state image sensor fails to meet the requirement of higher quality imaging.

In order to address the above problem, U.S. Pat. No. 5,965,875 discloses a photo-detecting device that enables to perform color separation of the incident light into the RGB primary colors without using the color filter. The disclosed photo-detecting device is formed by stacking a plurality of pn-junctions in silicon substrates which absorb red, green, and blue light separately, and performs color separation using the pn-junctions. Accordingly, efficiency of use for available light in the disclosed photo-detecting device is increased more than that in the photo-detecting device using the color filter. However, the disclosed photo-detecting device has a drawback that the light in one pn-junction is leaked into another pn-junction. As a result, color separation efficiency of the incident light in the disclosed photo-detecting device is decreased more than that in the photo-detecting device using the color filter. For example, blue light, which has not been converted into electric charges in a pn-junction of the top layer where blue light is converted, is leaked into a lower pn-junction where green light is converted.

The present invention provides a photo-detecting device that resolves the above problem and enables a solid-state image sensor to meet the requirement of higher quality imaging.

In view of the foregoing, an object of the present invention is to provide a photo-detecting device for converting incident light into electric charges including: a first silicon substrate having a pn-junction; a first SOI substrate in which a second silicon substrate having a pn-junction is formed on a first SOI insulation layer; and a second SOI substrate in which a third silicon substrate having a pn-junction is formed on a second SOI insulation layer, wherein the first silicon substrate, the first SOI substrate and the second SOI substrate are sequentially stacked, each pn-junction of the first silicon substrate, the second silicon substrate and the third silicon substrate forms a photodiode that converts the light into electric charges, and a depth of the pn-junction of each silicon substrate corresponds to an absorption depth of the light to be converted into electric charges, the depth of the pn-junction being a depth from a surface of the second SOI substrate irradiated with the light. Here, the pn-junction of the first silicon substrate may convert red light into electric charges, the pn-junction of the second silicon substrate may convert green light into electric charges, and the pn-junction of the third silicon substrate may convert blue light into electric charges. The pn-junction of the first silicon substrate may be positioned at a depth where the red light is absorbed, the pn-junction of the second silicon substrate may be positioned at a depth where the green light is absorbed, and the pn-junction of the third silicon substrate may be positioned at a depth where the blue light is absorbed. The pn-junction of the first silicon substrate may be positioned at the depth of 1.5 μm to 3.0 μm, the pn-junction of the second silicon substrate may be positioned at the depth of 0.5 μm to 1.5 μm, and the pn-junction of the third silicon substrate may be positioned at the depth of 0.2 μm to 0.5 μm. One of p-type and n-type regions in the first silicon substrate, the second silicon substrate, and the third silicon substrate are formed by doping, into the respective silicon substrates, dopants that are made of different materials for the respective silicon substrates, and character of the dopant material corresponds to a wavelength range of the light to be converted into electric charges in the pn-junction.

Accordingly, the photo-detecting device according to the present invention can use all of red, green and blue light of the light incident on a single photo-detecting device in order to increase efficiency of use for available light in the photo-detecting device and consequently to improve color reproducibility of images in the solid-state image sensor, so that the photo-detecting device enables the solid-state image sensor to meet the requirement of higher quality imaging. Further, the photo-detecting device according to the present invention can perform RGB primary color sensing at the same location so that the photo-detecting device enables the solid-state image sensor to achieve higher resolution of images. Still further, the photo-detecting device according to the present invention can perform color separation of the incident light into red, green, and blue light without using a color filter, and also without using multiple kinds of photo-detecting devices converting only one of red, green, and blue light into electric charges, so that the photo-detecting device enables the solid-state image sensor to meet the requirement of further size minimization. Still further, arrangement of the p- and n-type regions in each silicon substrate can be individually changed not to depend on arrangement of the p- and n-type regions in other silicon substrates, so that the photo-detecting device according to the present invention can enhance design flexibility.

Furthermore, the first SOI substrate and the second SOI substrate may have each filtering function for filtering light of a specific wavelength range. The first SOI substrate may have the filtering function for cutting off green light, and the second SOI substrate may have the filtering function for cutting off blue light, the cutting off including blocking or reflecting. The first SOI insulation layer may have a thickness so that the green light is reflected on the first SOI insulation layer, and the second SOI insulation layer may have a thickness so that the blue light is reflected on the second SOI insulation layer. The first SOI insulation layer may have the thickness of 94 nm, and the second SOI insulation layer may have the thickness of 80 nm.

Accordingly, the photo-detecting device according to the present invention can completely cut off light leakage onto a wrong substrate which converts different light, in order to perform color separation of the incident light more distinctly, so that the photo-detecting device enables the solid-state image sensor to improve resolution of images.

Still further, the photo-detecting device may include a light-collecting film that is formed on the surface of the second SOI substrate irradiated with the light, and that is made of a photonic crystal. The photonic crystal may collects at least one of blue light, green light, and red light.

Accordingly, the photonic crystals serve as a lens for efficiently collecting the incident light without reflecting the light on the surface (with 50% increase in light absorption efficiency), in order to efficiently collect red, green, and blue light of the light incident on the photo-detecting device, resulting in further increase of the efficiency of use for available light in the photo-detecting device, so that the photo-detecting device according to the present invention enables the solid-state image sensor to achieve further higher quality imaging.

Here, the photo-detecting device may further include a photocatalyst film that is formed on a surface of the photonic crystal irradiated with the light, and that is made of titanium oxide, wherein the titanium oxide has a photocatalyst function that is caused by visible light.

Accordingly, the photo-detecting device according to the present invention can have antifouling and anti-mist functions on its surface irradiated with the light, in order to increase the efficiency of use for available light in the photo-detecting device, so that the photo-detecting device enables the solid-state image sensor to achieve still further higher quality imaging.

Another object of the present invention is to provide a solid-state image sensor having an imaging area where photo-detecting devices for converting incident light into electric charges are two-dimensionally arranged.

Accordingly, the photo-detecting device according to the present invention has high efficiency of use for available light in the photo-detecting device, and converts all of red, green and blue light of the light incident on a single photo-detecting device into electric charges, so that the photo-detecting device enables the solid-state image sensor to achieve high-quality imaging and size minimization.

The photo-detecting device according to the present invention enables the solid-state image sensor to meet the requirement of the desired higher quality imaging. The photo-detecting device according to the present invention also enables the solid-state image sensor to achieve high resolution of images. The photo-detecting device according to the present invention further enables the solid-state image sensor to achieve size minimization. The photo-detecting device according to the present invention still further enables to achieve more design flexibility.

Accordingly, the present invention provides a photo-detecting device that enables a solid-state image sensor to meet the requirement of higher quality imaging and more size minimization, resulting in the solid-state image sensor with high-performance that is highly suitable for practical use.

FURTHER INFORMATION ABOUT TECHNICAL BACKGROUND TO THIS APPLICATION

The disclosure of Japanese Patent Application No. 2004-087510 filed on Mar. 24, 2004 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings which illustrate a specific embodiment of the invention. In the Drawings:

Figure 2:
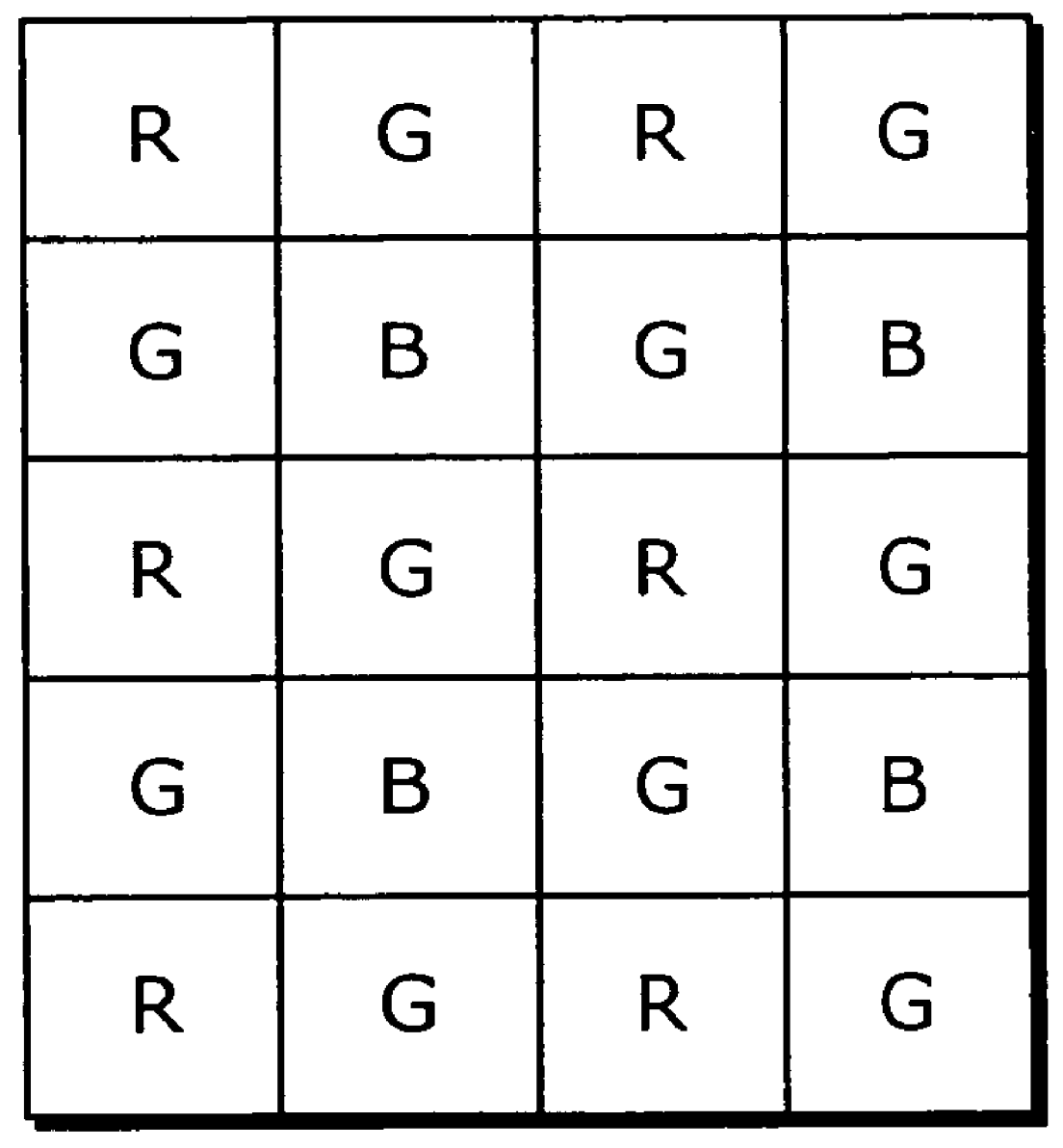

FIG. 2 is a diagram showing a RGB primary color array in a color filter 820;

FIG. 11 is a graph showing light intensity distribution of red, green, and blue light in the photo-detecting device according to the present embodiment.

DESCRIPTION OF THE PREFERRED EMBODIMENT

The following describes a MOS solid-state image sensor according to an embodiment of the present invention with reference to the drawings.

Figure 1:
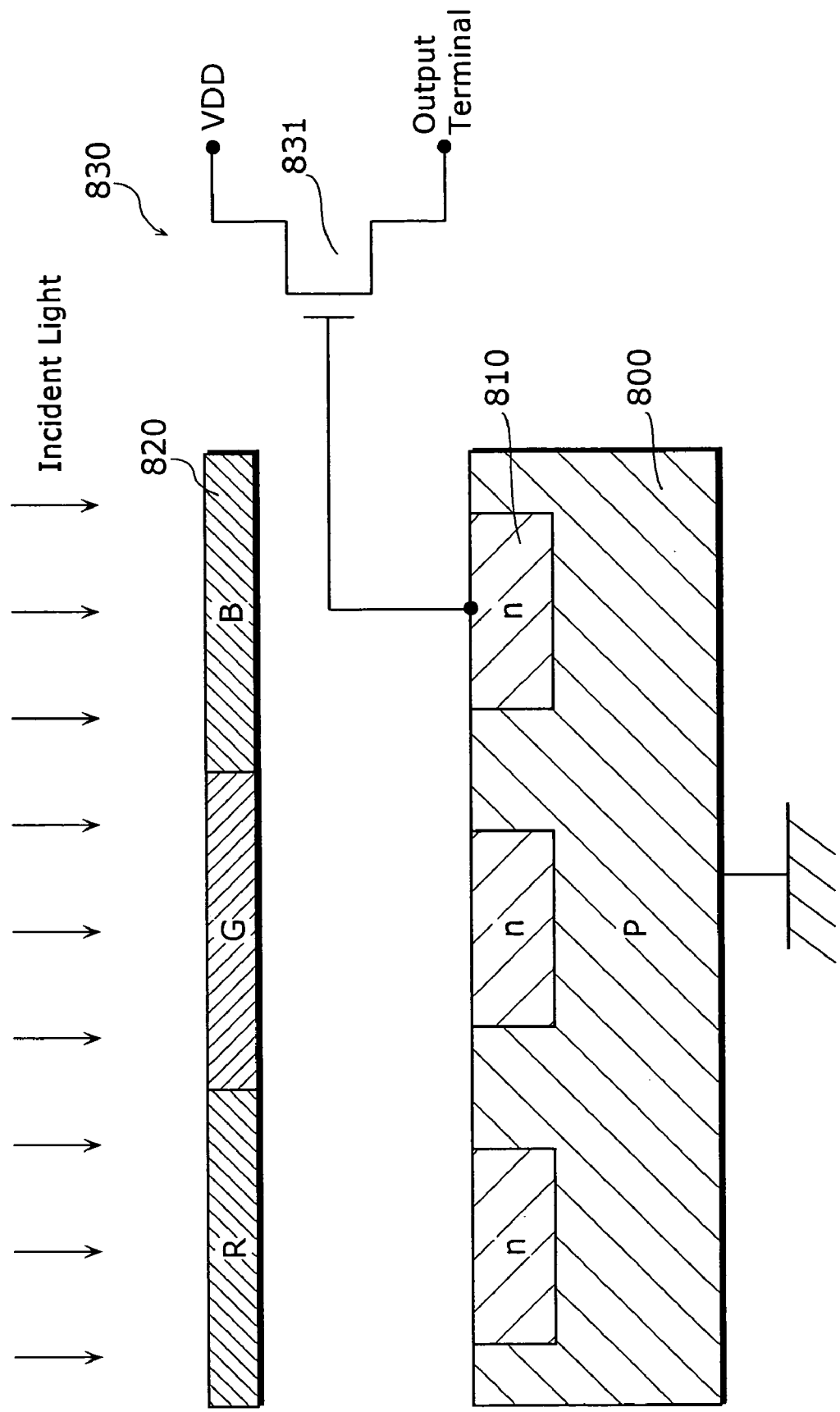
FIG. 1 is a cross-sectional view showing structures of a photo-detecting device in a conventional MOS solid-state image sensor and its periphery.
Figure 3:
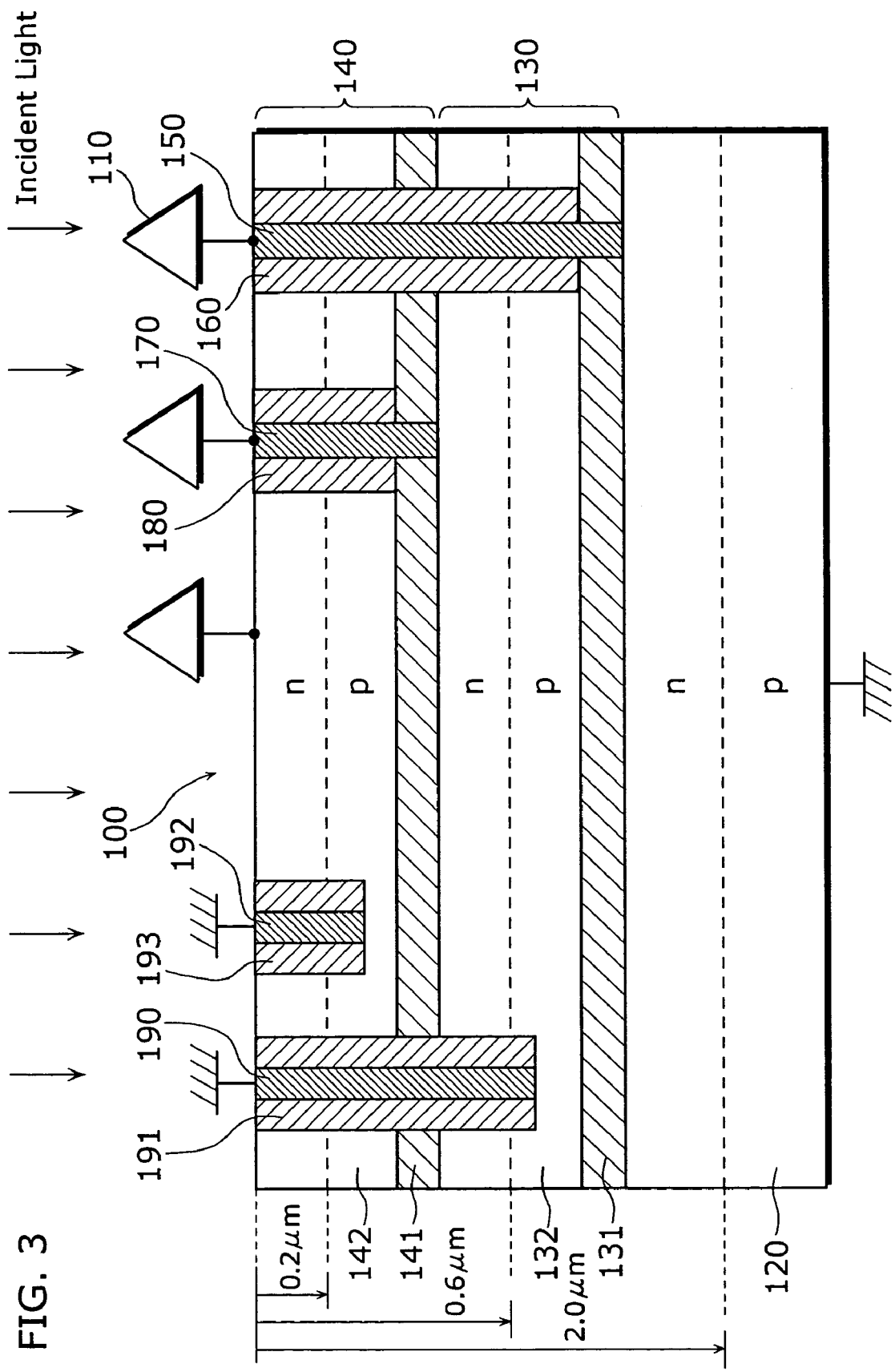
FIG. 3 is a cross-sectional view showing structures of a photo-detecting device in a MOS solid-state image sensor and its periphery, according to the present embodiment.

FIG. 3 is a cross-sectional view showing structures of a photo-detecting device in the MOS solid-state image sensor structures and its periphery, according to the present embodiment.

Referring now to FIG. 3, the solid-state image sensor according to the present embodiment is comprised of: a photo-detecting device 100; and output amplifiers 110 that have each MOS transistors, that are connected with the photo-detecting device 100, and that convert signal charges into voltage, and amplify and output the voltage.

The photo-detecting device 100 that includes bonding silicon-on-insulator (SOI) substrates is formed by sequentially stacking: a first silicon substrate 120; a first SOI substrate 130 in which a second silicon substrate 132 is formed on a first SOI insulation layer 131; and a second SOI substrate 140 in which a third silicon substrate 142 is formed on a second SOI insulation layer 141.

It should be noted that the first silicon substrate 120, the second silicon substrate 132, and the third silicon substrate 142 have respective p- and n-type regions. A pn-junction of the first silicon substrate 120 is formed at a depth in the stacked silicon substrates of about 1.5 µm to 3.0 µm, for example 2.0 µm, measured from the surface of the second SOI substrate 140 where the photo-detecting device 100 is irradiated with the light. Another pn-junction of the second silicon substrate 132 is formed at a depth in the stacked silicon substrates of about 0.5 µm to 1.5 µm, for example 0.6 µm, measured from the surface of the photo-detecting device 100 irradiated with the light. A further pn-junction of the third silicon substrate 142 is formed at a depth in the stacked silicon substrates of about 0.2 µm to 0.5 µm, for example 0.2 µm, measured from the surface of the photo-detecting device 100 irradiated with the light.

The first SOI substrate 130 has a structure including: a first wiring 150 that electrically connects the n-type region in the first silicon substrate 120 with the output amplifier 110; a first SiO$_2$ film 160 that electrically insulates the first wiring 150 from the second silicon substrate 132; a third wiring 190 that grounds the p-type region in the second silicon substrate 132; and a third SiO$_2$ film 191 that electrically insulates the third wiring 190 from the n-type region in the second silicon substrate 132.

The second SOI substrate 140 has a structure including: the first wiring 150; the first SiO$_2$ film 160; a second wiring 170 that electrically connects the n-type region in the second silicon substrate 132 with the output amplifier 110; a second SiO$_2$ film 180 that electrically insulates the second wiring 170 from the third silicon substrate 142; the third wiring 190; the third SiO$_2$ film 191; a fourth wiring 192 that grounds the p-type region in the third silicon substrate 142; and a fourth SiO$_2$ film 193 that electrically insulates the fourth wiring 192 from the n-type region in the third silicon substrate 142.

Figure 4:
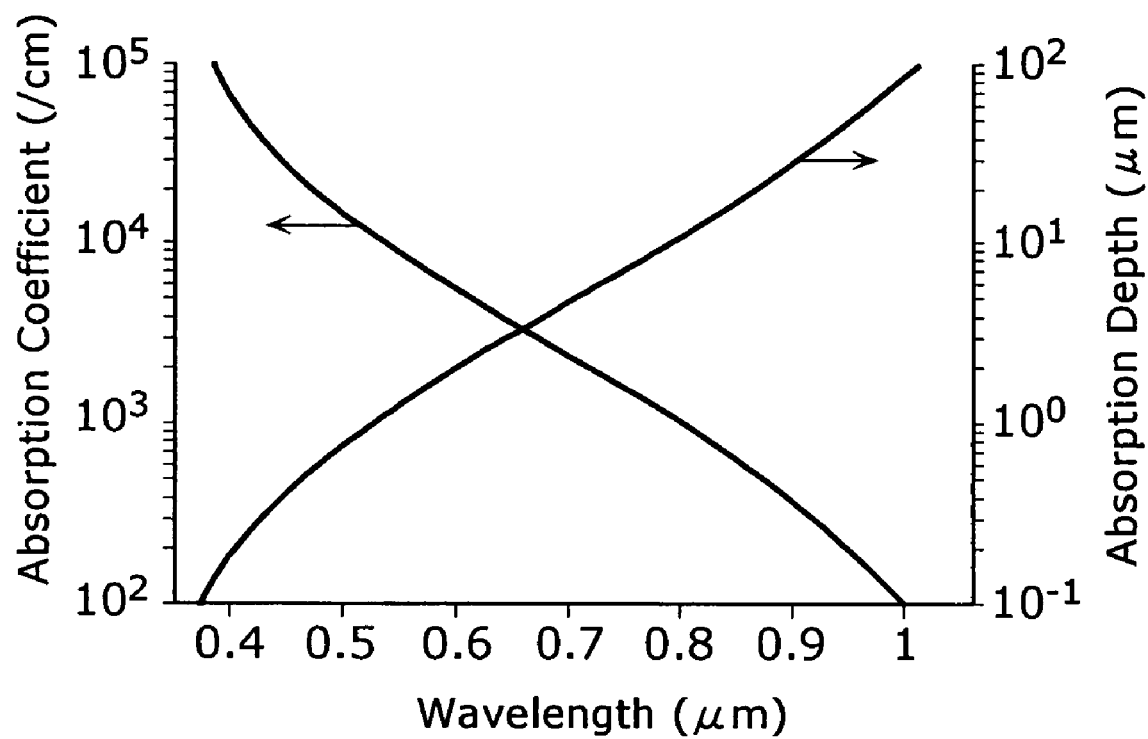
FIG. 4 is a graph showing absorption depth in silicon of visual light.

In the photo-detecting device having the above-described structure, the pn-junction of each silicon substrate forms a photodiode that converts light of a specific wavelength into electric charges. For example, the pn-junction of the first silicon substrate 120 forms a red-sensitive photodiode that converts light of a wavelength ranging from 575 nm to 700 nm, which is red light, into electric charges. The pn-junction of the second silicon substrate 132 forms a green-sensitive photodiode that converts light of a wavelength ranging from 490 nm to 575 nm, which is green light, into electric charges. The pn-junction of the third silicon substrate 142 forms a blue-sensitive photodiode that converts light of a wavelength ranging from 400 nm to 490 nm, which is blue light, into electric charges. The above character is caused by differences in absorption depth in silicon of visual light as shown in FIG. 4. FIG. 4 shows that red light is absorbed at a depth in the silicon of about 1.5 µm to 3.0 µm, that green light is absorbed at a depth in the silicon of about 0.5 µm to 1.5 µm, and that blue light is absorbed at a depth in the silicon of about 0.2 µm to 0.5 µm.

FIGS. 5 to 8 are cross-sectional views showing a method for manufacturing the photo-detecting device having the above-described structure, according to the present embodiment. It should be noted that the reference numerals in FIG. 3 are assigned to identical elements throughout the separate views in FIGS. 5 to 8, and the details of those elements are same as described above.

Figure 5A:
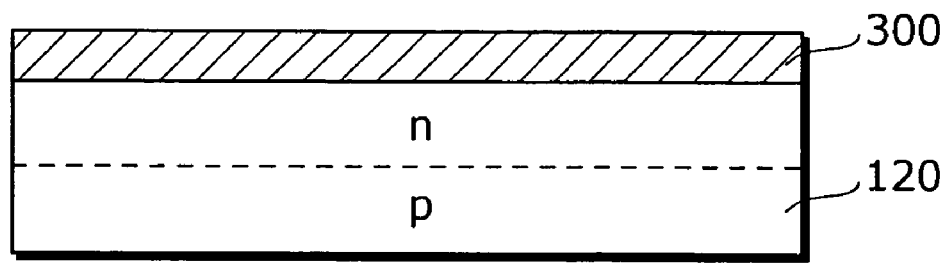
FIG. 5A is a cross-sectional view showing processes performed by a method for manufacturing the photo-detecting device according to the present embodiment.

Now, referring to FIG. 5A, an oxide film 300 is formed on the surface of the p-type first silicon substrate 120 using a thermal oxidation process or the like, and then an n-type dopant, for example phosphorus (P) with a dopant concentration of about $1 \times 10^{17}$ cm$^{-3}$, is doped from the side of the oxide film 300 into the first silicon substrate 120 in order to form an n-type region.

Figure 5B:
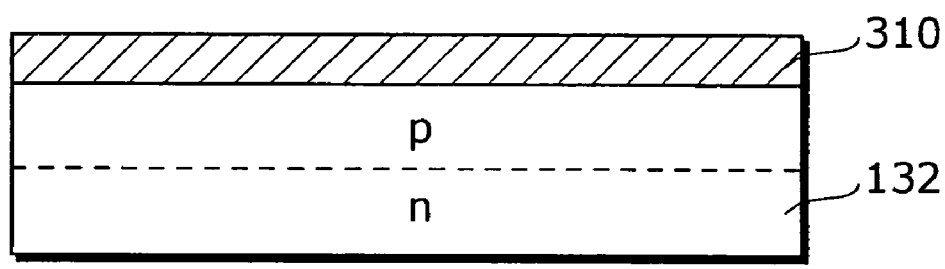
FIG. 5B is a cross-sectional view showing processes performed by the method for manufacturing the photo-detecting device according to the present embodiment.

Further, referring to FIG. 5B, an oxide film 310 is formed on the surface of the n-type second silicon substrate 132 using a thermal oxidation process or the like, and then a p-type dopant, for example boron (B) with a dopant concentration of about $5 \times 10^{16}$ cm$^{-3}$, is doped from the side of the oxide film 310 into the second silicon substrate 132 in order to form a p-type region.

Figure 5C:
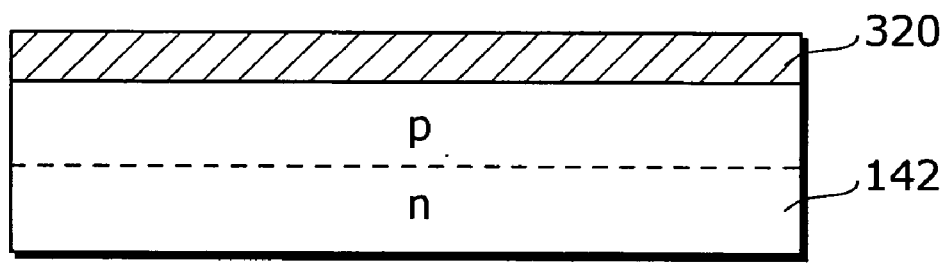
FIG. 5C is a cross-sectional view showing processes performed by the method for manufacturing the photo-detecting device according to the present embodiment.

Still further, referring to FIG. 5C, an oxide film 320 is formed on the surface of the n-type third silicon substrate 142 using a thermal oxidation process or the like, and then a p-type dopant, for example boron (B) with a dopant concentration of about $5 \times 10^{16}$ cm$^{-3}$, is doped from the side of the oxide film 320 into the third silicon substrate 142 in order to form a p-type region.

The present embodiment has described the manufacturing processes shown in FIGS. 5A to 5C in which the n-type dopant is doped into the p-type first silicon substrate 120, while the p-type dopants are doped into the n-type second silicon substrate 132 and the n-type third silicon substrate 142. However, the first silicon substrate 120 may be an n-type silicon substrate, and then a p-type dopant may be doped therein in order to form a p-type region, while the second silicon substrate 132 and the third silicon substrate 142 may be a p-type silicon substrate, and then n-type dopants are doped therein in order to form respective n-type regions.

A different kind of material may be doped into each silicon substrate at the manufacturing processes shown in FIGS. 5A to 5C. In this case, the dopant material is determined according to a wavelength of the light to be converted into electric charges in the pn-junction of each silicon substrate.

Figure 5D:
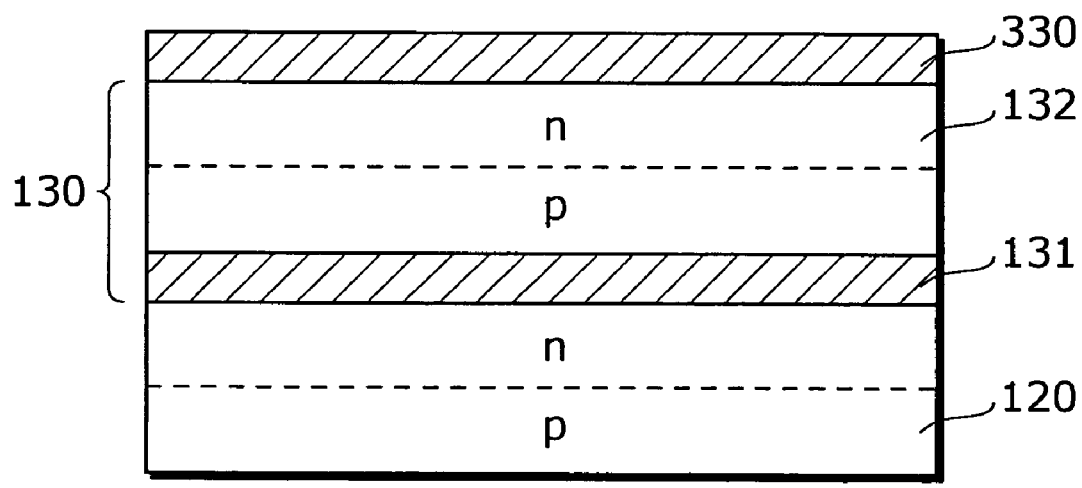
FIG. 5D is a cross-sectional view showing processes performed by the method for manufacturing the photo-detecting device according to the present embodiment.

Next, referring to FIG. 5D, the first silicon substrate 120 and the second silicon substrate 132 are bonded using a general SOI bonding technique, arranging the surfaces of the oxide film 300 and the oxide film 310 to be contacted each other, so that the resulting structure includes the first SOI substrate 130 that has the first SOI insulation layer 131 and the second silicon substrate 132. Then, an oxide film 330 is formed using a thermal oxidation process or the like on the surface of the first SOI substrate 130, on which the first silicon substrate 120 is not bonded.

Figure 6A:
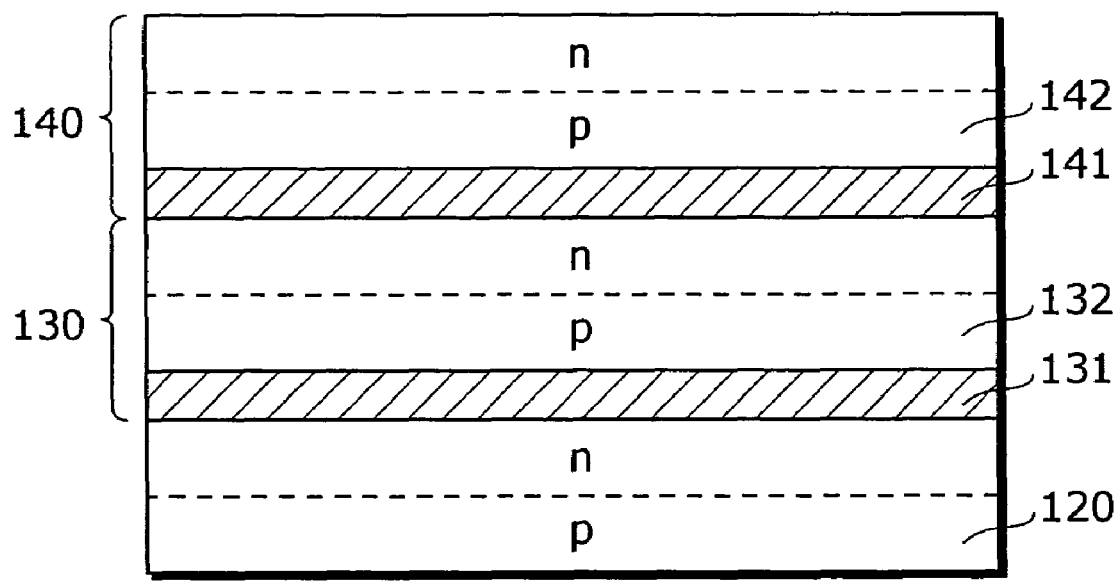
FIG. 6A is a cross-sectional view showing processes performed by the method for manufacturing the photo-detecting device according to the present embodiment.

Further, referring to FIG. 6A, the first SOI substrate 130 is bonded using a general SOI bonding technique on the third silicon substrate 142, arranging the surfaces of the oxide film 330 and the oxide film 320 to be contacted each other, so that the resulting structure includes the second SOI substrate 140 that has the second SOI insulation layer 141 and the third silicon substrate 142.

It should be noted that depth of the pn-junctions in the first silicon substrate 120, the second silicon substrate 132 and the third silicon substrate 142 are set as about 1.5 μm to 3.0 μm, about 0.5 μm to 1.5 μm, and about 0.5 μm to 1.5 μm, respectively, measured from the surface of the second SOI substrate 140, by adjusting the doping depth for the n- or p-type regions, the thickness of the oxide films, and the thickness of the silicon substrates.

Figure 6B:
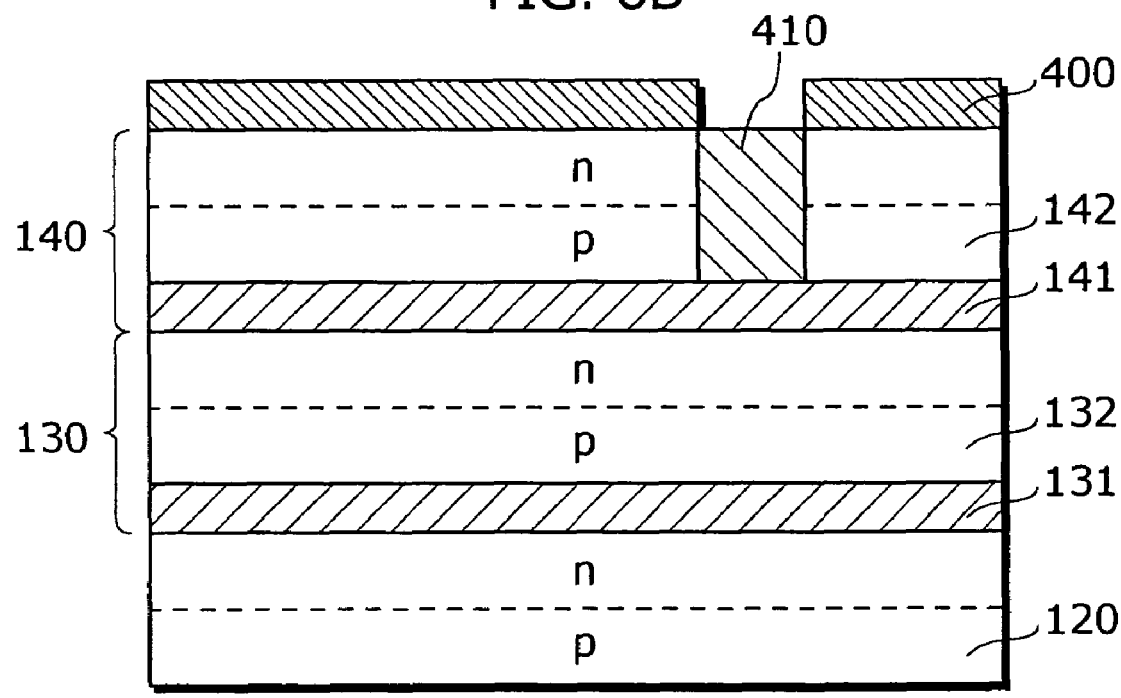
FIG. 6B is a cross-sectional view showing processes performed by the method for manufacturing the photo-detecting device according to the present embodiment.

Next, referring to FIG. 6B, a resist pattern 400 for forming an aperture is formed on the surface of the second SOI substrate 140, then the second SOI substrate 140 is etched through to expose the second SOI insulation layer 141, and a $SiO_2$ film 410 is buried into the aperture formed by the etching.

Figure 7A:
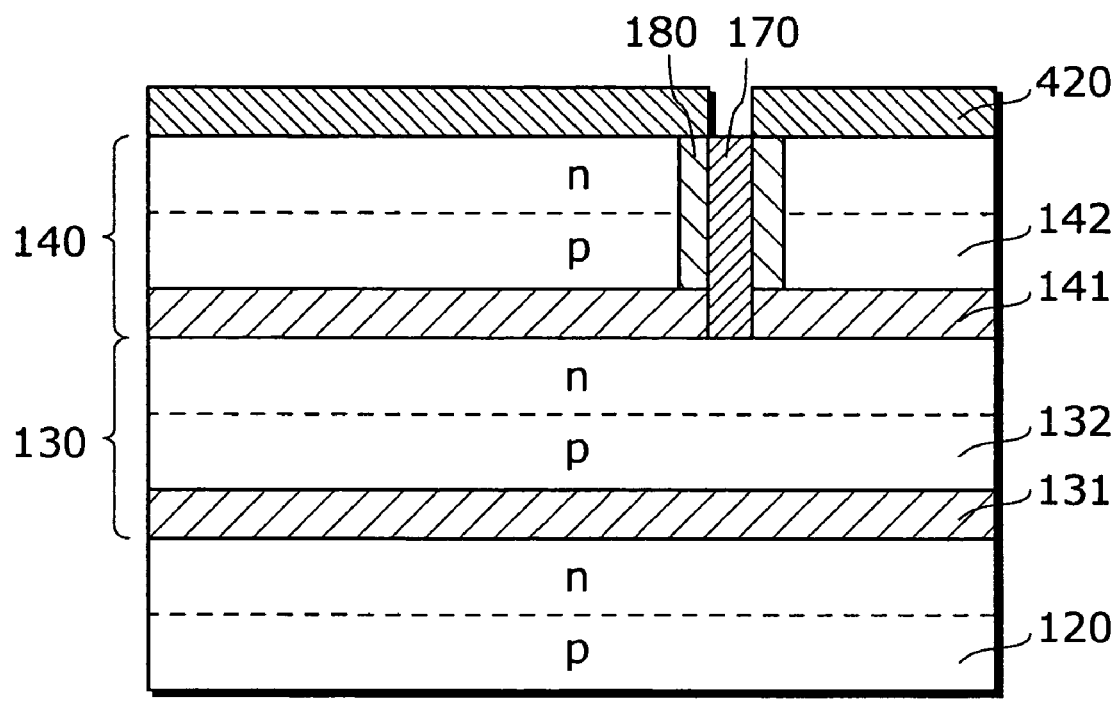
FIG. 7A is a cross-sectional view showing processes performed by the method for manufacturing the photo-detecting device according to the present embodiment.

Further, referring to FIG. 7A, another resist pattern 420 for forming the second wiring 170 is formed on the surface of the second SOI substrate 140, then the $SiO_2$ film 410 is etched through to expose the second silicon substrate 132, and an electrode material is buried into the aperture formed by the etching. The above manufacturing processes result in the second wiring 170 and the second $SiO_2$ film 180.

Figure 7B:
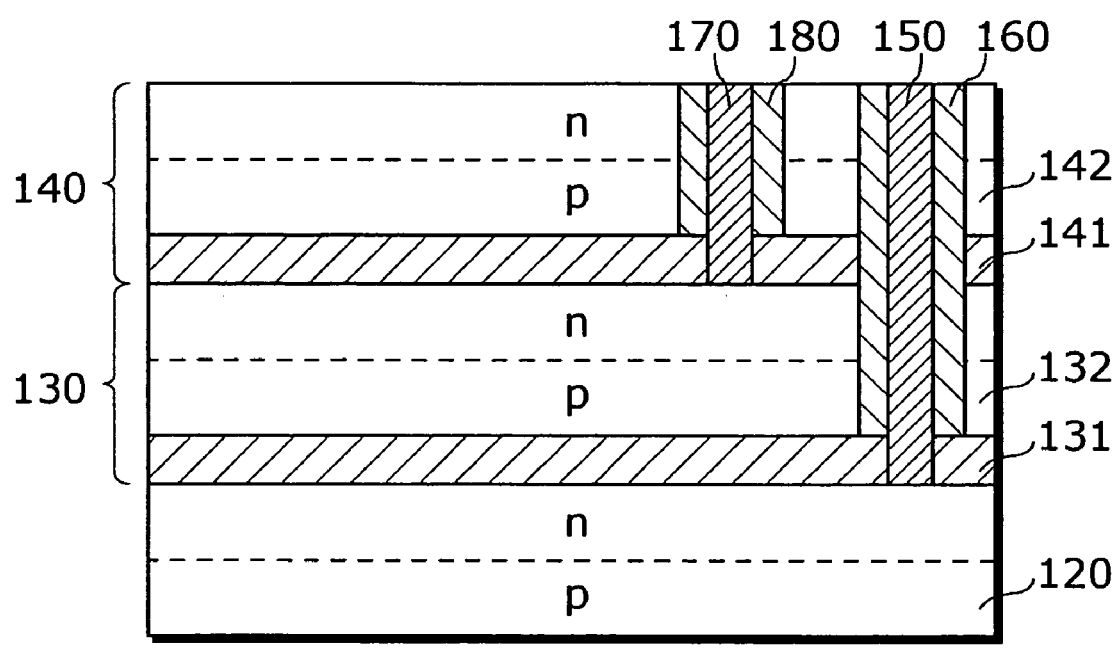
FIG. 7B is a cross-sectional view showing processes performed by the method for manufacturing the photo-detecting device according to the present embodiment.

Still further, referring to FIG. 7B, in the same manner as described above with reference to FIGS. 6B and 7A, the first SOI substrate 130 and the second SOI substrate 140 are etched and a $SiO_2$ film is buried therein, and then the $SiO_2$ film is etched and an electrode material is buried therein. The above manufacturing processes result in the first wiring 150 and the first $SiO_2$ film 160.

Figure 8A:
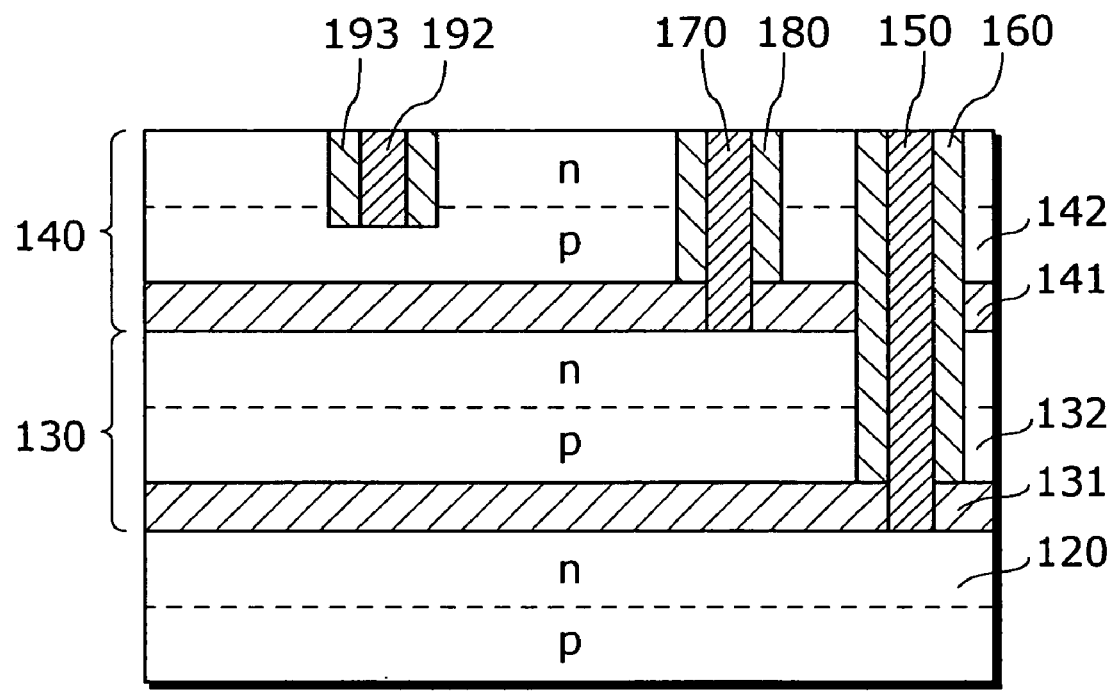
FIG. 8A is a cross-sectional view showing processes performed by the method for manufacturing the photo-detecting device according to the present embodiment.

Still further, referring to FIG. 8A, a resist pattern for forming an aperture is formed on the surface of the second SOI substrate 140, then the second SOI substrate 140 is etched through to expose the p-type region in the third silicon substrate 142, and a $SiO_2$ film is buried into the aperture formed by the etching. Subsequently, another resist pattern for forming the fourth wiring 192 is formed on the surface of the second SOI substrate 140, then the $SiO_2$ film is etched through to expose the p-type region in the third silicon substrate 142, and an electrode material is buried into the aperture formed by the etching. The above manufacturing processes result in the fourth wiring 192 and the fourth $SiO_2$ film 193.

Figure 8B:
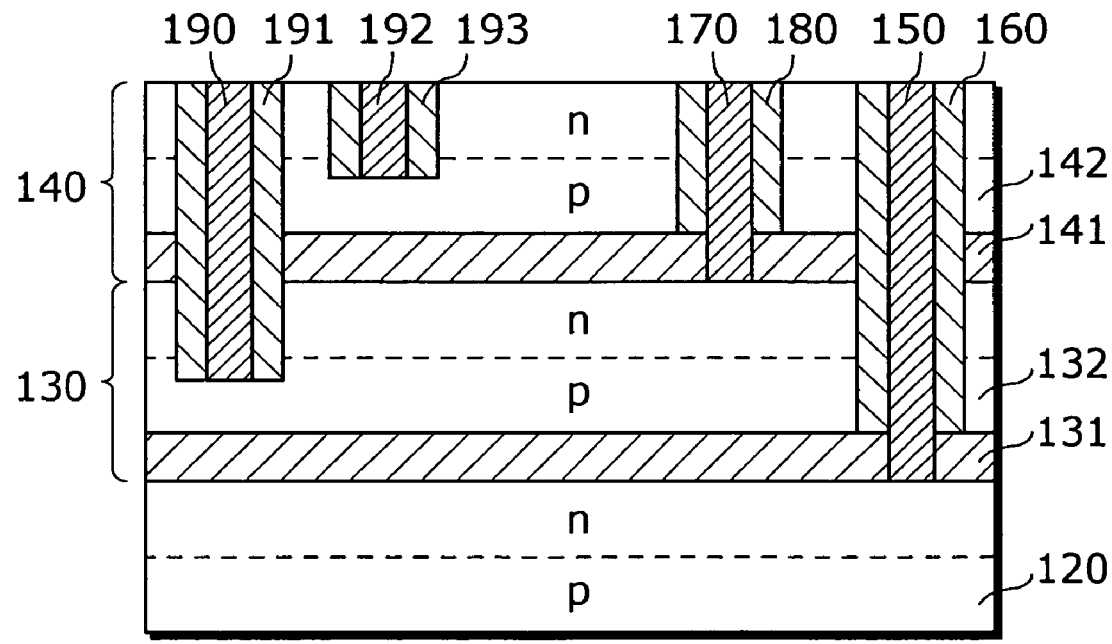
FIG. 8B is a cross-sectional view showing processes performed by the method for manufacturing the photo-detecting device according to the present embodiment.

Finally, referring to FIG. 8B, in the same manner as described above with reference to FIG. 8A, the first SOI substrate 130 and the second SOI substrate 140 are etched and a $SiO_2$ film is buried therein, and then the $SiO_2$ film is etched and an electrode material is buried therein. The above manufacturing processes result in a third wiring 190 and the third $SiO_2$ film 191. Eventually, the photo-detecting device has been manufactured by the above described method as shown in FIGS. 5 to 8.

As described above, in the photo-detecting device according to the present embodiment, the pn-junction of the first silicon substrate 120 converts red light into electric charges, the pn-junction of the second silicon substrate 132 converts green light into electric charges, and the pn-junction of the third silicon substrate 142 converts blue light into electric charges. Accordingly, the photo-detecting device according to the present embodiment can use all of red, green and blue light incident on a single photo-detecting device in order to increase efficiency of use for available light in the photo-detecting device and consequently to improve color reproducibility of images in the solid-state image sensor, so that the photo-detecting device enables the solid-state image sensor to meet the requirement of higher quality imaging. Further, the photo-detecting device according to the present embodiment can perform RGB primary color sensing at the same location so that the photo-detecting device enables the solid-state image sensor to meet the requirement of higher resolution of images. Still further, the photo-detecting device according to the present embodiment can perform color separation of the incident light into red, green, and blue light without using a color filter, and also without using multiple kinds of photo-detecting devices converting only one of red, green, and blue light into electric charges, so that the photo-detecting device enables the solid-state image sensor to meet the requirement of further size minimization.

Figure 9:
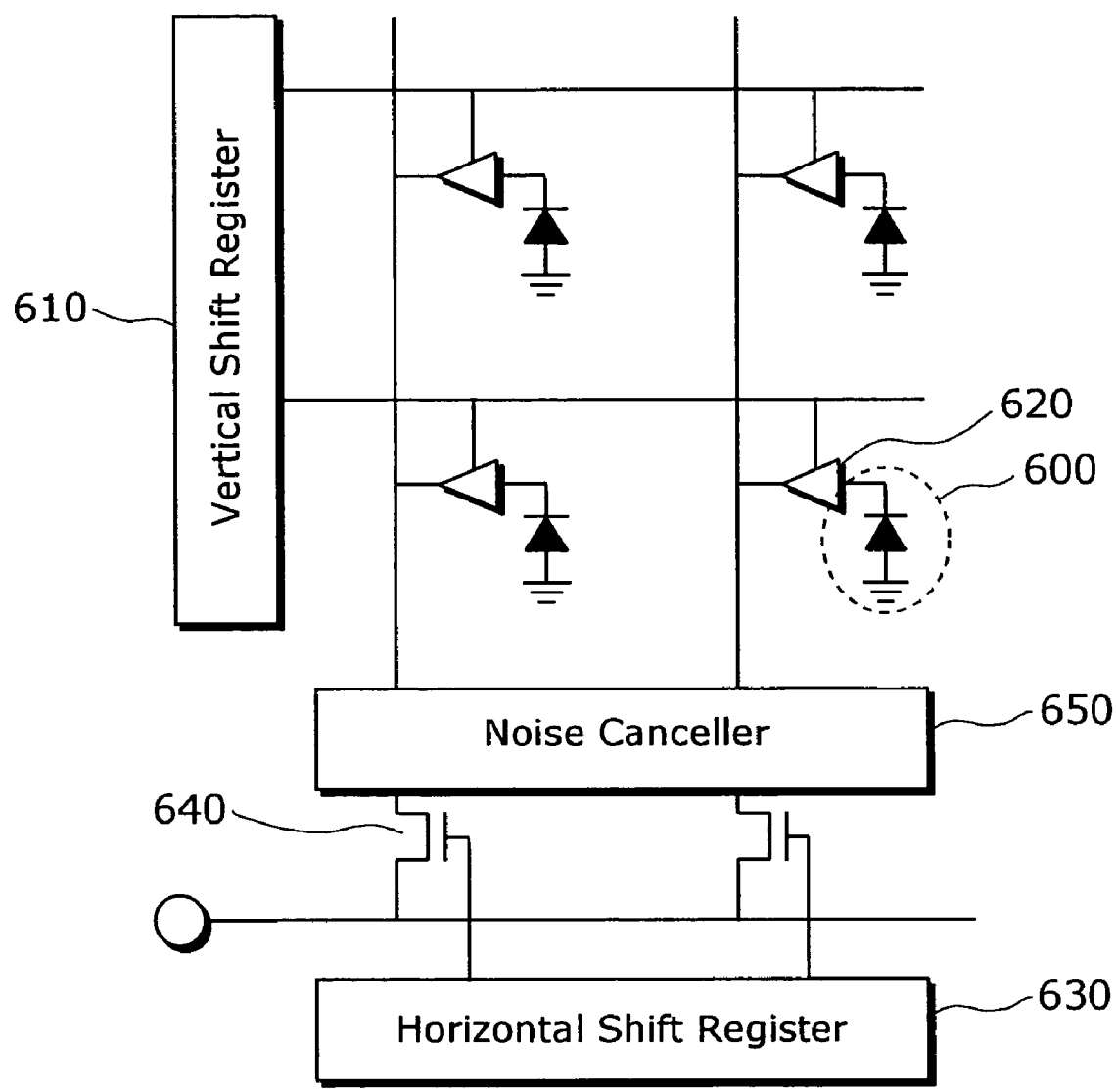
FIG. 9 is a diagram showing a circuit for reading out signal charges in the photo-detecting device according to the present embodiment.

As also described above, in the photo-detecting device according to the present embodiment, the first SOI insulation layer 131 is formed between the first silicon substrate 120 and the second silicon substrate 132, and the second SOI insulation layer 141 is formed between the second silicon substrate 132 and the third silicon substrate 142. Accordingly, arrangement of the p- and n-type regions in each silicon substrate can be individually changed not to depend on arrangement of the p- and n-type regions in other silicon substrates, so that the photo-detecting device according to the present embodiment can enhance design flexibility. Moreover, the photo-detecting device according to the present embodiment electrically separates the pn-junctions from one another in order to separate electronic charges generated from light, so that the photo-detecting device can simplify a circuit for reading out those electric charges. FIG. 9 is an example of such a circuit for reading out the signal charges in the above case. In the circuit, for example, a vertical shift register 610 and electric charge output amplifiers 620 select a row of the photo-detecting devices 600 from which signal charges are to be read out, from photo-detecting devices 600 that are two-dimensionally arranged in the solid-state image sensor. A horizontal shift register 630 and readout transistors 640 in the circuit select a column of the photo-detecting devices 600 from which signal charges are to be read out. Then in the circuit, the signal charges are output through a noise canceller 650 for eliminating noises caused in the sensor.

Figure 10:
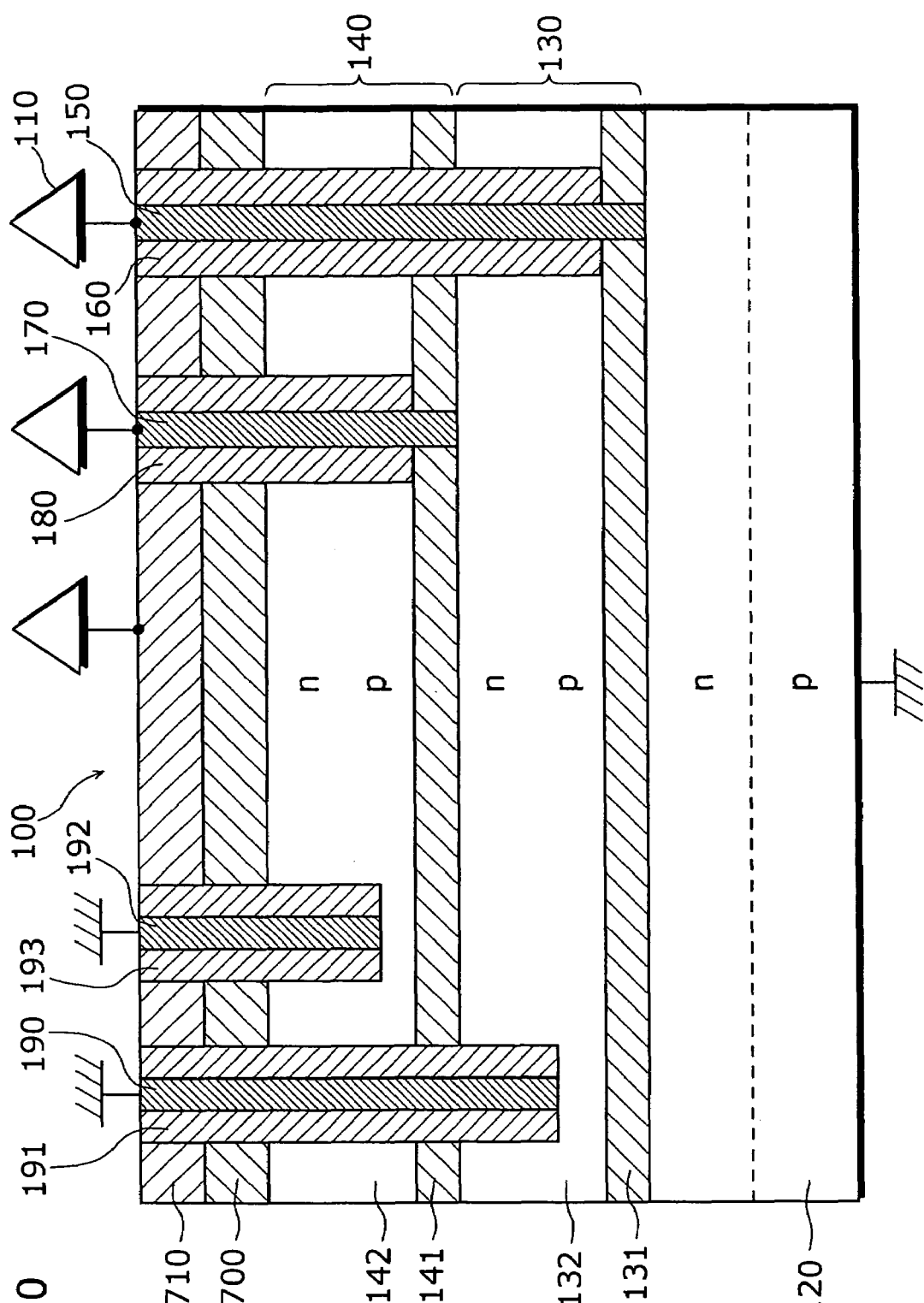
FIG. 10 is a cross-sectional view showing structures of the photo-detecting device in the MOS solid-state image sensor and its periphery, according to the present embodiment.

The photo-detecting device according to the present embodiment, as shown in a cross-sectional view of a MOS solid-state image sensor in FIG. 10, may include, on the surface of the photo-detecting device irradiated with the light, a light-collecting film 700 made of photonic crystals that have a flat dispersion surface and that efficiently collect the light of particular wavelengths, such as red, green, and blue light. Accordingly, the photonic crystals serve as a lens for efficiently collecting the incident light without reflecting the light on the surface (with 50% increase in light absorption efficiency), in order to efficiently collect red, green, and blue light of the light incident on the photo-detecting device, resulting in further increase of the efficiency of use for available light in the photo-detecting device, so that the photo-detecting device enables the solid-state image sensor to achieve further higher quality imaging.

The photo-detecting device according to the present embodiment, as shown in the cross-sectional view of the MOS solid-state image sensor in FIG. 10, may also include, on the surface of the photo-detecting device irradiated with the light, a photocatalyst film 710 made of titanium oxide that shows photocatalyst activity by irradiation of visible light. Accordingly, the photo-detecting device according to the present embodiment can have antifouling and anti-mist functions on its surface irradiated with the light, in order to increase the efficiency of use for available light in the photo-detecting device, so that the photo-detecting device enables the solid-state image sensor to achieve still further higher quality imaging.

In the photo-detecting device according to the present embodiment, the first SOI substrate 130 may have a green light filtering function in order to cut off (block or reflect) green light, and the second SOI substrate 140 may have a blue light filtering function in order to cut off blue light. Accordingly, the photo-detecting device can completely cut off light leakage onto a wrong substrate which converts different light, in order to perform color separation of the incident light more distinctly, so that the photo-detecting device enables the solid-state image sensor to improve resolution of images. Such filtering function can be implemented by setting the thickness of the first SOI insulation layer 131 as one fourth of a green light wavelength in order to increase reflectivity of green light in the first SOI insulation layer 131, and setting the thickness of the second SOI insulation layer 141 as one fourth of a blue light wavelength in order to increase reflectivity of blue light in the second SOI insulation layer 141. For example, the first SOI insulation layer 131 and the second SOI insulation layer 141 are made of a $SiO_2$ insulating film (n (refractive index)=1.46) having a thickness of 94 nm and a $SiO_2$ insulating film (n=1.46) having a thickness of 80 nm respectively, or a SiN insulating film (n=2.1) having a thickness of 65 nm and an SiN insulating film (n=2.1) having a thickness of 56 nm respectively. FIG. 11 is a graph showing light intensity distribution of red, green, and blue light in the photo-detecting device in the above case. As shown in FIG. 11, the curves of the light intensity distribution of red, green, and blue light in the photo-detecting device that includes the insulation layers with the reflection function (full lines in FIG. 11) fall more sharply than the curves of the light intensity distribution in the conventional photo-detecting device without the reflection function (dashed lines in FIG. 11).

Furthermore, the MOS solid-state image sensor according to the present embodiment may include a circuit connected with the photo-detecting devices in order to add and subtract electric charges converted from red and green light in the pn-junction of the third silicon substrate 142, and electric charges converted from red light in the pn-junction of the second silicon substrate 132. Accordingly, the MOS solid-state image sensor according to the present embodiment can perform color separation of the light more distinctly, providing a photo-detecting device that enables the solid-state image sensor to improve resolution of images.

The present embodiment has described the method for manufacturing the photo-detecting device in which the pn-junctions are formed beforehand in the respective silicon substrates, and then such silicon substrates are sequentially bonded. However, the silicon substrates may be bonded beforehand, and then the pn-junctions may be formed in the respective silicon substrates. For example, after bonding three n-type silicon substrates, dopants of phosphorus (P) are doped into respective silicon substrates in order to form: a pn-junction that converts red light into electric charges, using ion implantation with implantation energy of about 1.1 MeV; another pn-junction that converts green light into electric charges, using ion implantation with implantation energy of about 290 KeV; a further pn-junction that converts blue light into electric charges, using ion implantation with implantation energy of about 200 KeV. Accordingly, the above ion implantation provides: the pn-junction that converts red light into electric charges at a depth of about 1.0 µm; the pn-junction that converts green light into electric charges at a depth of about 0.3 µm; and the pn-junction that converts blue light into electric charges at a depth of about 0.2 µm, respectively, in the silicon measured from the surface of the photo-detecting device irradiated with the light.

INDUSTRIAL APPLICABILITY

The present invention can be utilized for a photo-detecting device, and more particularly for a photo-detecting device in a solid-state image sensor.

What is claimed is:

1. A photo-detecting device for converting incident light into electric charges comprising:
   a first silicon substrate having a pn-junction;
   a first SOI substrate in which a second silicon substrate having a pn-junction is formed on a first SOI insulation layer; and
   a second SOI substrate in which a third silicon substrate having a pn-junction is formed on a second SOI insulation layer;
   a light-collecting film that is formed on the surface of said second SOI substrate irradiated with the light, and that is made of a photonic crystal; and
   a photocatalyst film that is formed on a surface of the photonic crystal irradiated with the light, and that is made of titanium oxide,
   wherein said first silicon substrate, said first SOI substrate and said second SOI substrate are sequentially stacked,
   said each pn-junction of said first silicon substrate, said second silicon substrate and said third silicon substrate forms a photodiode that converts the light into electric charges, and
   a depth of said pn-junction of said each silicon substrate corresponds to an absorption depth of the light to be converted into electric charges, the depth of said pn-junction being a depth from a surface of said second SOI substrate irradiated with the light, and
   the titanium oxide has a photocatalyst function that is caused by visible light.

2. The photo-detecting device according to claim 1, wherein said pn-junction of said first silicon substrate converts red light into electric charges,
   said pn-junction of said second silicon substrate converts green light into electric charges, and said pn-junction of said third silicon substrate converts blue light into electric charges.

3. The photo-detecting device according to claim 2, wherein said pn-junction of said first silicon substrate is positioned at a depth where the red light is absorbed, said pn-junction of said second silicon substrate is positioned at a depth where the green light is absorbed, and said pn-junction of said third silicon substrate is positioned at a depth where the blue light is absorbed.

4. The photo-detecting device according to claims 3, wherein said pn-junction of said first silicon substrate is positioned at the depth of 1.5 µm to 3.0 µm, said pn-junction of said second silicon substrate is positioned at the depth of 0.5 µm to 1.5 µm, and said pn-junction of said third silicon substrate is positioned at the depth of 0.2 µm to 0.5 µm.

5. The photo-detecting device according to claim 4, wherein said first SOI insulation layer has a thickness so that the green light is reflected on said first SOI insulation layer, and said second SOI insulation layer has a thickness so that the blue light is reflected on said second SOI insulation layer.

6. The photo-detecting device according to claim 5, wherein said first SOI insulation layer has the thickness of 94 nm, and said second SOI insulation layer has the thickness of 80 nm.

7. The photo-detecting device according to claim 6, wherein one of p-type and n-type regions in said first silicon substrate, said second silicon substrate, and said third silicon substrate are formed by doping, into said respective silicon substrates, dopants that are made of different materials for said respective silicon substrates, and character of the dopant material corresponds to a wavelength range of the light to be converted into electric charges in said pn-junction.

8. The photo-detecting device according to claim 7, wherein the photonic crystal collects at least one of blue light, green light, and red light.

9. The photo-detecting device according to claim 1, wherein said first SOI substrate and said second SOI substrate have each filtering function for filtering light of a specific wavelength range.

10. The photo-detecting device according to claim 9, wherein said first SOI substrate has the filtering function for cutting off green light, and said second SOI substrate has the filtering function for cutting off blue light, the cutting off including blocking or reflecting.

11. The photo-detecting device according to claim 1, wherein said pn-junction of said first silicon substrate is positioned at a depth where the red light is absorbed, said pn-junction of said second silicon substrate is positioned at a depth where the green light is absorbed, and said pn-junction of said third silicon substrate is positioned at a depth where the blue light is absorbed.

12. The photo-detecting device according to claim 1, wherein said pn-junction of said first silicon substrate is positioned at the depth of 1.5 µm to 3.0 µm, said pn-junction of said second silicon substrate is positioned at the depth of 0.5 µm to 1.5 µm, and said pn-junction of said third silicon substrate is positioned at the depth of 0.2 µm to 0.5 µm.

13. The photo-detecting device according to claim 1, wherein said first SOI insulation layer has a thickness so that the green light is reflected on said first SOI insulation layer, and said second SOI insulation layer has a thickness so that the blue light is reflected on said second SOI insulation layer.

14. The photo-detecting device according to claim 1, wherein said first SOI insulation layer has the thickness of 94 nm, and said second SOI insulation layer has the thickness of 80 nm.

15. The photo-detecting device according to claim 1, wherein one of p-type and n-type regions in said first silicon substrate, said second silicon substrate, and said third silicon substrate are formed by doping, into said respective silicon substrates, dopants that are made of different materials for said respective silicon substrates, and character of the dopant material corresponds to a wavelength range of the light to be converted into electric charges in said pn-junction.

16. The photo-detecting device according to claim 1, further comprising
a light-collecting film that is formed on the surface of said second SOI substrate irradiated with the light, and that is made of a photonic crystal.

17. A solid-state image sensor having an imaging area where photo-detecting devices for converting incident light into electric charges are two-dimensionally arranged, wherein said photo-detecting device includes:
a first silicon substrate having a pn-junction;
a first SOI substrate in which a second silicon substrate having a pn-junction is formed on a first SOI insulation layer; and
a second SOI substrate in which a third silicon substrate having a pn-junction is formed on a second SOI insulation layer;
a light-collecting film that is formed on the surface of said second SOI substrate irradiated with the light, and that is made of a photonic crystal; and
a photocatalyst film that is formed on a surface of the photonic crystal irradiated with the light, and that is made of titanium oxide,
wherein said first silicon substrate, said first SOI substrate and said second SOI substrate are sequentially stacked,
said each pn-junction of said first silicon substrate, said second silicon substrate and said third silicon substrate forms a photodiode that converts the light into electric charges, and
a depth of said pn-junction of said each silicon substrate corresponds to an absorption depth of the light to be converted into electric charges, the depth of said pn-junction being a depth from a surface of said second SOI substrate irradiated with the light, and
the titanium oxide has a photocatalyst function that is caused by visible light.

* * * * *